United States Patent
Inden et al.

(10) Patent No.: US 9,564,224 B2
(45) Date of Patent: Feb. 7, 2017

(54) SEMICONDUCTOR DEVICE (71) Applicant: Kabushiki Kaisha Toshiba, Minato-ku (JP)

(72) Inventors: Tomoya Inden, Yokkaichi (JP); Kimitoshi Okano, Yokkaichi (JP); Kiyoshi Okuyama, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/848,647

(22) Filed: Sep. 9, 2015

(65) Prior Publication Data

US 2016/0232976 A1    Aug. 11, 2016

Related U.S. Application Data (60) Provisional application No. 62/113,102, filed on Feb. 6, 2015.

(51) Int. Cl.
| | |
|---|---|
| *G11C 11/34* | (2006.01) |
| *G11C 16/10* | (2006.01) |
| *H01L 27/02* | (2006.01) |
| *H01L 27/115* | (2006.01) |
| *H01L 23/535* | (2006.01) |
| *H01L 23/528* | (2006.01) |
| *G11C 16/12* | (2006.01) |
| *G11C 16/06* | (2006.01) |

(52) U.S. Cl.
CPC ............. *G11C 16/10* (2013.01); *G11C 16/12* (2013.01); *H01L 23/528* (2013.01); *H01L 23/535* (2013.01); *H01L 27/0222* (2013.01); *H01L 27/11521* (2013.01); *H01L 27/11526* (2013.01); *H01L 27/11568* (2013.01); *H01L 27/11573* (2013.01); *G11C 16/06* (2013.01)

(58) Field of Classification Search
CPC .......... G11C 16/10; G11C 16/30; G11C 16/12
USPC .................... 365/174, 177, 185.18
See application file for complete search history.

(56) References Cited

U.S. PATENT DOCUMENTS

| | | | |
|---|---|---|---|
| 2005/0104120 A1 | 5/2005 | Ichige et al. | |
| 2006/0175670 A1 | 8/2006 | Tsubaki | |
| 2008/0272443 A1 | 11/2008 | Hoshi et al. | |
| 2010/0265773 A1* | 10/2010 | Lung .................. | G11C 16/0458 365/185.27 |
| 2012/0248544 A1* | 10/2012 | Yokoyama .............. | H01L 21/84 257/369 |

FOREIGN PATENT DOCUMENTS

| | | |
|---|---|---|
| JP | 2006-237286 | 9/2006 |
| JP | 2006-253654 | 9/2006 |
| JP | 2008-277604 | 11/2008 |

* cited by examiner

*Primary Examiner* — Son Dinh
(74) *Attorney, Agent, or Firm* — Oblon, McClelland, Maier & Neustadt, L.L.P.

(57) ABSTRACT

A semiconductor device according to an embodiment comprises: a field effect transistor comprising a semiconductor layer and a gate electrode; a wiring line layer positioned above the field effect transistor; and a control circuit that adjusts a voltage of a wiring line in the wiring line layer. The wiring line layer comprises: a contact wiring line connected to a source or a drain of the field effect transistor; and a first wiring line facing a position between the gate electrode and the contact wiring line, of the semiconductor layer. The control circuit adjusts the contact wiring line to a certain voltage and sets the first wiring line to a floating state.

16 Claims, 9 Drawing Sheets

SEMICONDUCTOR DEVICE

CROSS-REFERENCE TO RELATED APPLICATIONS

This application is based upon and claims the benefit of U.S. Provisional Patent Application No. 62/113,102, filed on Feb. 6, 2015, the entire contents of which are incorporated herein by reference.

FIELD

Embodiments described herein relate to a semiconductor device.

BACKGROUND

Description of the Related Art

An integrated circuit comprising a plurality of MOS type (MIS type) field effect transistors formed on a semiconductor substrate, is known. Sometimes, a high voltage transistor having a comparatively large withstand voltage is formed in part of such an integrated circuit.

DETAILED DESCRIPTION

A semiconductor device according to an embodiment comprises: a field effect transistor comprising a semiconductor layer and a gate electrode; a wiring line layer positioned above the field effect transistor; and a control circuit that adjusts a voltage of a wiring line in the wiring line layer. The wiring line layer comprises: a contact wiring line connected to a source or a drain of the field effect transistor; and a first wiring line facing a position between the gate electrode and the contact wiring line, of the semiconductor layer. The control circuit adjusts the contact wiring line to a certain voltage and sets the first wiring line to a floating state.

The semiconductor device will be described below with reference to the drawings.

First Embodiment

Figure 1:
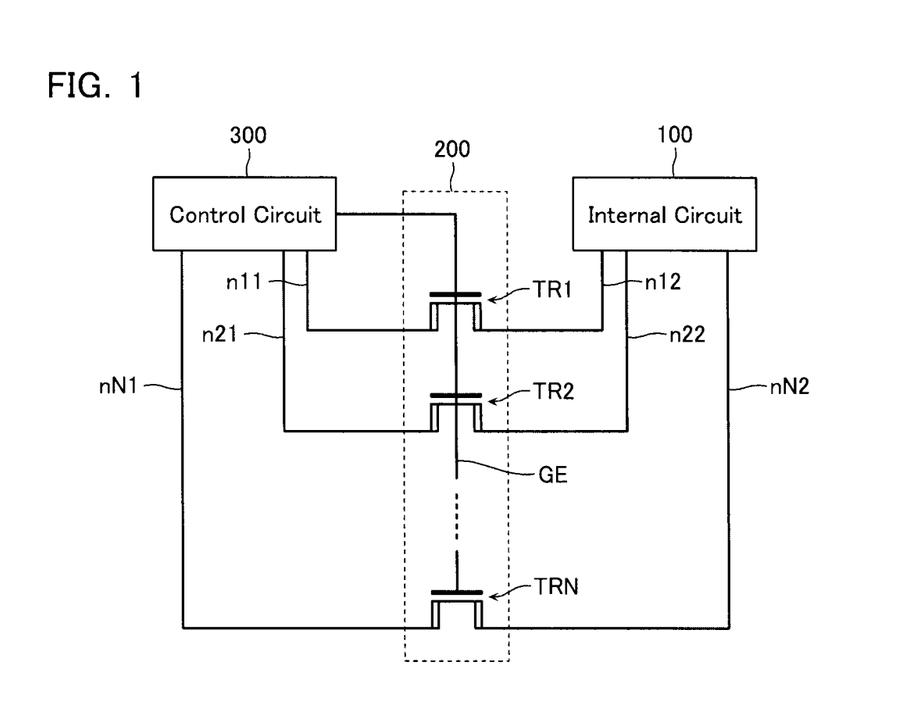
FIG. 1 is a circuit block diagram showing a configuration example of a semiconductor device according to a first embodiment.

FIG. 1 is a circuit block diagram showing a configuration example of a semiconductor device according to a first embodiment. As shown in FIG. 1, the semiconductor device according to the present embodiment comprises: an internal circuit 100; a voltage transfer circuit 200 that transfers a voltage for driving the internal circuit 100; and a control circuit 300 that supplies such a voltage to the voltage transfer circuit and performs drive control of the internal circuit 100 and the voltage transfer circuit 200. The internal circuit 100, the voltage transfer circuit 200, and the control circuit 300 may be part of an integrated circuit formed on an identical substrate, for example.

A variety of configurations are adoptable as the internal circuit 100. For example, the internal circuit 100 may be a storage circuit such as a flash memory, MRAM (Magnetic Random Access Memory), DRAM (Dynamic Random Access Memory), ReRAM (Resistive Random Access Memory), and so on, or a sensor circuit, a radio wave transmitting circuit or receiving circuit, and so on. Moreover, as shown in FIG. 1, the internal circuit 100 is connected to the voltage transfer circuit 200 by a plurality of terminals.

As shown in FIG. 1, the voltage transfer circuit 200 includes N (N is a positive integer) high voltage transistors TR1, TR2, . . . , TRN. Drain terminals of these plurality of high voltage transistors TR1, TR2, . . . , TRN are respectively connected to the control circuit 300 via nodes n11, n21, . . . , nN1. In addition, source terminals of the high voltage transistors TR1, TR2, . . . , TRN are respectively connected to the internal circuit 100 via nodes n12, n22, . . . , nN2. Moreover, gate electrodes GE of these plurality of high voltage transistors TR1, TR2, . . . , TRN are commonly connected and are connected to the control circuit 300.

The control circuit 300 includes, for example, a control unit such as a CPU, and a voltage generating unit that generates a voltage of a certain magnitude from a supplied voltage. This voltage generating unit may comprise the likes of a charge pump circuit. The charge pump circuit hays, for example, rectifying elements (for example, diodes, or the like) and capacitors. These diodes and one ends of the capacitors are alternately connected in series. The other ends of these capacitors are inputted with a clock signal and an inverted clock signal.

Note that in the configuration shown in FIG. 1, the gate electrodes GE of the plurality of high voltage transistors TR1, TR2, . . . , TRN are commonly connected, but these gate electrodes GE of the high voltage transistors TR1, TR2, . . . , TRN may be controlled independently by the control circuit 300. Moreover, other connection relationships are also appropriately adjustable.

Figure 2:
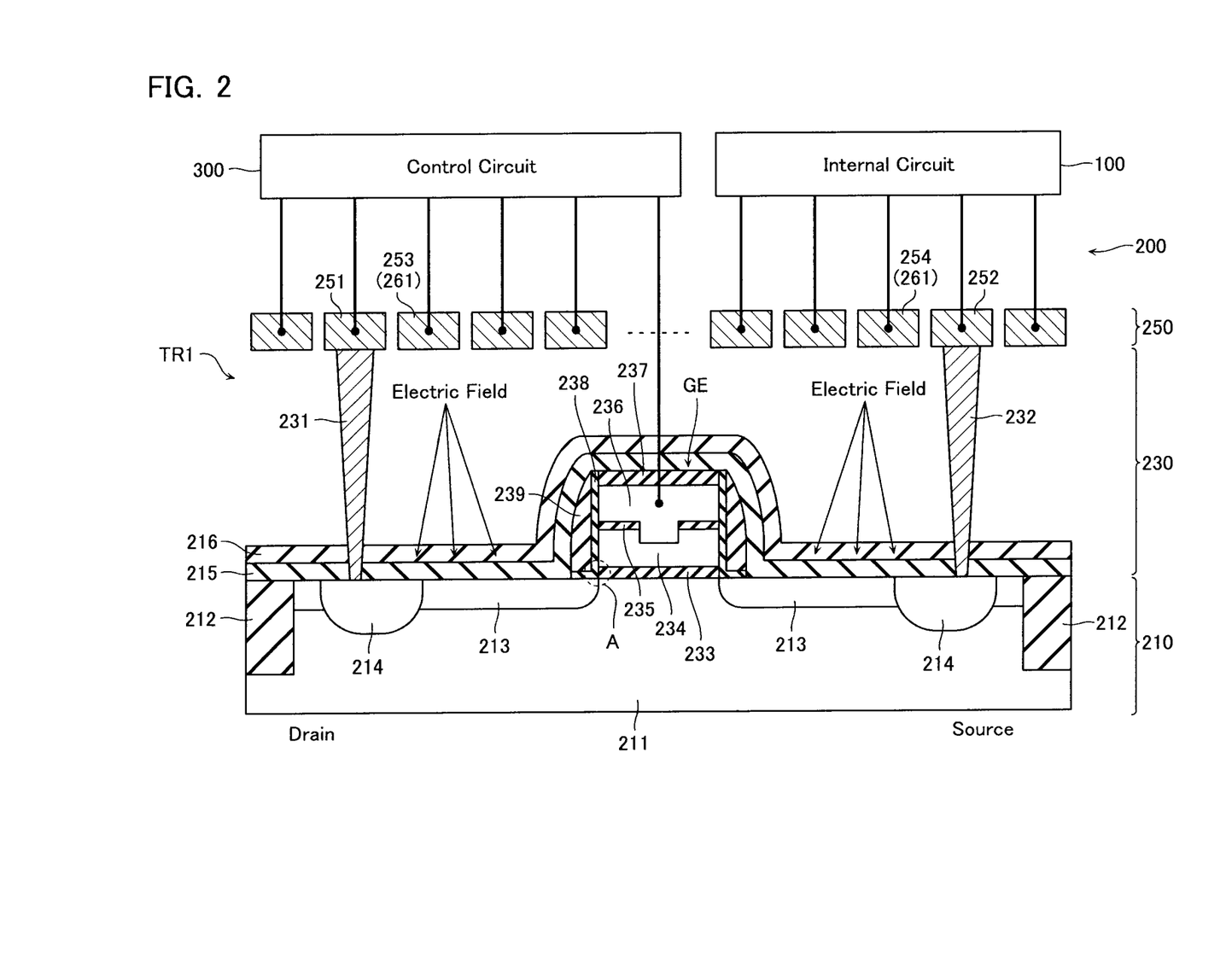
FIG. 2 is a schematic cross-sectional view of a voltage transfer circuit 200 according to the same embodiment.

Next, a configuration of the voltage transfer circuit 200 according to the present embodiment will be described in more detail with reference to FIG. 2. FIG. 2 is a schematic cross-sectional view of the voltage transfer circuit 200 according to the present embodiment.

As shown in FIG. 2, the voltage transfer circuit 200 is a CMOS circuit that includes agate layer 230 and a metal wiring line layer 250 on a substrate layer 210. FIG. 2 shows only the high voltage transistor TR1, but the voltage transfer circuit 200 includes the plurality of high voltage transistors TR1, TR2, . . . , TRN formed in a matrix on a substrate 211. The high voltage transistors TR2, . . . , TRN may, for example, be formed in plurality in a source-drain direction of FIG. 2 and divided by an insulating layer 212. The high voltage transistors TR2, . . . , TRN may, for example, by formed in plurality in a left-right direction of the plane of paper and a perpendicular direction of the plane of paper in FIG. 2.

As shown in FIG. 2, the substrate layer 210 is mainly configured from the semiconductor substrate 211. The upper surface of the semiconductor substrate 211 is provided with a portion functioning as an active area of the high voltage transistor TR1. Moreover, both ends of this portion are provided with a low concentration diffusion layer 213. Furthermore, provided close to both ends of the low concentration diffusion layer 213 is a high concentration diffusion layer 214. Provided even more to the outside than the high concentration diffusion layer 214 is the insulating layer 212 that divides fellow diffusion layers of the high voltage transistors adjacent in the source-drain direction. Note that in the present embodiment, the low concentration diffusion layer 213 has a length of a certain extent or more in the source-drain direction. In other words, the portion functioning as the active area of the high voltage transistor TR1 and the high concentration diffusion layer 214 are separated to a certain extent or more.

The semiconductor substrate 211 is configured from a semiconductor such as silicon (Si) or germanium (Ge), for example. The low concentration diffusion layer 213 and the high concentration diffusion layer 214 are implanted with an impurity such as phosphorus (P), for example. An impurity concentration in the low concentration diffusion layer 213 is comparatively low, and an electrical resistance value in the low concentration diffusion layer 213 is comparatively high. On the other hand, an impurity concentration in the high concentration diffusion layer 214 is comparatively high, and an electrical resistance value in the high concentration diffusion layer 214 is comparatively low.

As shown in FIG. 2, formed in the gate layer 230 are: the gate electrode GE functioning as a gate of the high voltage transistor TR1; an oxide layer 215 and a nitride layer 216 (first insulating layer) covering an upper surface of the semiconductor substrate 211 and an upper surface and a side surface of the gate electrode GE; and a drain contact electrode 231 and source contact electrode 232 that penetrate the oxide layer 215 and the nitride layer 216 and that are connected to the high concentration diffusion layer 214. The drain contact electrode 231 functions as part of the node n11. The source contact electrode 232 functions as part of the node n12.

As shown in FIG. 2, the gate electrode GE includes the following stacked sequentially on the portion functioning as the active area of the high voltage transistor TR1, of the semiconductor substrate 211 upper surface, namely: a first insulating layer 233; a first gate electrode conductive layer 234; a second insulating layer 235; a second gate electrode conductive layer 236; and a third insulating layer 237. Moreover, sidewalls of these layers are covered by a fourth insulating layer 238 and a fifth insulating layer 239.

The first insulating layer 233, the second insulating layer 235, and the fifth insulating layer 239 are configured from silicon oxide (SiO$_2$), for example. The first gate electrode conductive layer 234 is configured from polysilicon, for example. The second gate electrode conductive layer 236 is configured from polysilicon or tungsten (W), for example. The third insulating layer 237 and the fourth insulating layer 238 are configured from silicon nitride (SiN), for example. Note that configuration or material, and so on, of the gate electrode GE, are appropriately changeable.

As shown in FIG. 2, the oxide layer 215 and the nitride layer 216 cover the upper surface of the semiconductor substrate 211 and the upper surface and the side surface of the gate electrode GE, respectively. The oxide layer 215 is configured from silicon oxide (SiO$_2$), for example. Additionally, the oxide layer 215 has a film thickness of approximately 10 nm, for example. The nitride layer 216 configured from silicon nitride (SiN), for example. Additionally, the nitride layer 216 has a film thickness of approximately 30 nm, for example.

As shown in FIG. 2, the drain contact electrode 231 and the source contact electrode 232 extend in a direction perpendicular to the semiconductor substrate 211, contact the high concentration diffusion layer 214 at their lower ends, and are connected to a metal wiring line in the metal wiring line layer 250 at their upper ends. In the present embodiment, the drain contact electrode 231 and the source contact electrode 232 are formed from a conductive layer of a metal or the like. Note that the drain contact electrode 231 and the source contact electrode 232 can be formed by, for example, forming a contact hole in an insulating layer not illustrated, and implanting therein a metal or the like acting as a material. In this case, as shown in FIG. 2, the drain contact electrode 231 and the source contact electrode 232 are formed in a tapered shape which is thinner the closer they are to the substrate and thicker the more distant they are from the substrate.

Note that, among components of the gate layer 230, an inter layer insulating layer not illustrated may be embedded. The inter layer insulating layer may be a film configured from silicon oxide (SiO$_2$) formed using TEOS (Tetraethyl orthosilicate).

As shown in FIG. 2, the metal wiring line layer 250 includes a plurality of metal wiring lines arranged in plurality in the source-drain direction and extending in a direction perpendicular to the plane of paper of FIG. 2. Some of these plurality of metal wiring lines are connected to the control circuit 300 and function as part of the nodes n11, n21, . . . , nN1. Moreover, some of the plurality of metal wiring lines are connected to the internal circuit 100 and function as part of the nodes n12, n22, . . . , nN2.

As shown in FIG. 2, heights of lower ends and upper ends, of the plurality of metal wiring lines in the metal wiring line layer 250, are equal. Moreover, these plurality of metal wiring lines include: a drain wiring line 251 connected at its lower end to the drain contact electrode 231; and a source wiring line 252 connected at its lower end to the source contact electrode 232. Moreover, as shown in FIG. 2, a plurality of metal wiring lines 253 face the low concentration diffusion layer 213, between the drain contact electrode 231 and the gate electrode GE. Similarly, a plurality of metal wiring lines 254 face the low concentration diffusion layer 213, also between the source contact electrode 232 and the gate electrode GE. Note that the metal wiring lines 253 and 254 may be connected or unconnected to another high voltage transistor in the voltage transfer circuit 200.

Next, operation of the semiconductor device according to the present embodiment will be described with reference to FIGS. 1 and 2. Described below will be the case where a first voltage (for example, 20 V to 30 V) is applied to a certain terminal of the internal circuit 100 via the node n12, and a second voltage (for example, 0.5 V to 6 V) is applied to a plurality of terminals of the internal circuit 100 via the nodes n22, . . . , nN2.

In such a case, the control circuit 300 adjusts a voltage of the node n11 to the first voltage, adjusts a voltage of the nodes n21, . . . , nN1 to the second voltage, and furthermore applies a gate voltage to the gate electrode GE, for example. As a result, the high voltage transistors TR1, TR2, . . . , TRN attain an ON state, a first voltage is transferred to the node n12 of the internal circuit 100, and a second voltage is transferred to each of the nodes n22, . . . , nN2 of the internal circuit 100.

Moreover, the control circuit 300 sets a voltage of the metal wiring lines 253 and 254 when transferring a certain voltage to the internal circuit 100 higher compared to a voltage of the metal wiring lines 253 and 254 when not transferring a voltage to the internal circuit 100. Note that the voltage of the metal wiring lines 253 and 254 when transferring a certain voltage to the internal circuit 100 is adjusted to be larger than the second voltage transferred to the internal circuit 100, for example.

Now, as shown in FIG. 2, in the present embodiment, the low concentration diffusion layer 213 provided along a certain distance is provided between the portion functioning as the active area of the high voltage transistor TR1 and the high concentration diffusion layer 214. Therefore, even in the case where, for example, a comparatively large voltage is applied between the drain contact electrode 231 and the gate electrode GE, it is possible to change the voltage gently in the low concentration diffusion layer 213 and prevent dielectric breakdown due to a local voltage drop. As a result, withstand voltage of the high voltage transistor TR1 is raised.

Now, in order to raise the withstand voltage of the high voltage transistor TR1, it is preferable for the impurity concentration of the low concentration diffusion layer 213 to be set low and the electrical resistance value in the low concentration diffusion layer 213 to be set high. However, in this case, a current flowing between source and drain of the high voltage transistor TR1 decreases and drive power of the voltage transfer circuit 200 ends up lowering.

On the other hand, if the impurity concentration of the low concentration diffusion layer 213 is set high, the electrical resistance value in the low concentration diffusion layer 213 lowers, and it becomes possible to increase the current flowing between source and drain of the high voltage transistor TR1 and thereby improve drive power of the voltage transfer circuit 200. However, if the impurity concentration of the low concentration diffusion layer 213 is set high, then sometimes, in the case where a comparatively large voltage is applied between the drain contact electrode 231 and the gate electrode GE, a voltage concentrates in a portion "A" between an end portion of the low concentration diffusion layer 213 and the gate electrode GE, and dielectric breakdown ends up occurring in this portion "A".

Now, in the present embodiment, the control circuit 300 sets the voltage of the metal wiring lines 253 and 254 when transferring a certain voltage to the internal circuit 100 higher compared to the voltage of the metal wiring lines 253 and 254 when not transferring a voltage to the internal circuit 100. Therefore, when transferring a certain voltage to the internal circuit 100, the electrical resistance value of the low concentration diffusion layer 213 can be reduced and drive power of the voltage transfer circuit 200 can be improved by an electric field generated from the metal wiring lines 253 and 254. Moreover, when not transferring a voltage to the internal circuit 100, dielectric breakdown in the above-described portion "A" can be prevented by reducing the electric field generated from the metal wiring lines 253 and 254 and reducing the electrical resistance of the low concentration diffusion layer 213. That is, drive power of the voltage transfer circuit 200 and withstand voltage of the high voltage transistor TR1 can be simultaneously achieved.

Hereafter, it is assumed that a wiring line used in reduction of the electrical resistance value of the low concentration diffusion layer 213 by the electric field is called a first wiring line 261. It is possible to select as the first wiring line 261 any wiring line positioned between the drain wiring line 251 and the source wiring line 252. For example, as shown in FIG. 2, the metal wiring line 253 adjacent to the drain wiring line 251 and the metal wiring line 254 adjacent to the source wiring line 252 may be selected as the first wiring line 261. Moreover, it is also possible for a plurality of three or more metal wiring lines to be selected as the first wiring line 261. Furthermore, the first wiring line 261 may be connected or unconnected to a source terminal, a drain terminal, or a gate terminal of the other high voltage transistors TR2, . . . , TRN. Moreover, the first wiring line 261 may be connected or unconnected to the internal circuit 100. In the case that the first wiring line 261 is not connected to another high voltage transistor or the internal circuit, a voltage applied to the first wiring line 261 can be flexibly adjusted, and the electrical resistance of the low concentration diffusion layer 213 can be adjusted, without consideration for the internal circuit 100.

Moreover, the voltage of the first wiring line 261 is adjustable by a variety of methods. For example, it is also possible for the metal wiring line 253 adjacent to the drain wiring line 251 to be selected as the first wiring line 261, or for the metal wiring line 254 adjacent to the source wiring line 252 to be selected as the first wiring line 261, and for these metal wiring lines to be set to a floating state. In this case, a voltage of the first wiring line 261 is adjusted to a voltage larger than the second voltage, by capacitive coupling with the drain wiring line 251 or the source wiring line 252. Moreover, it is also possible, for example, to generate a certain voltage in the control circuit 300 and thereby adjust the voltage of the first wiring line 261.

Second Embodiment

Figure 3:
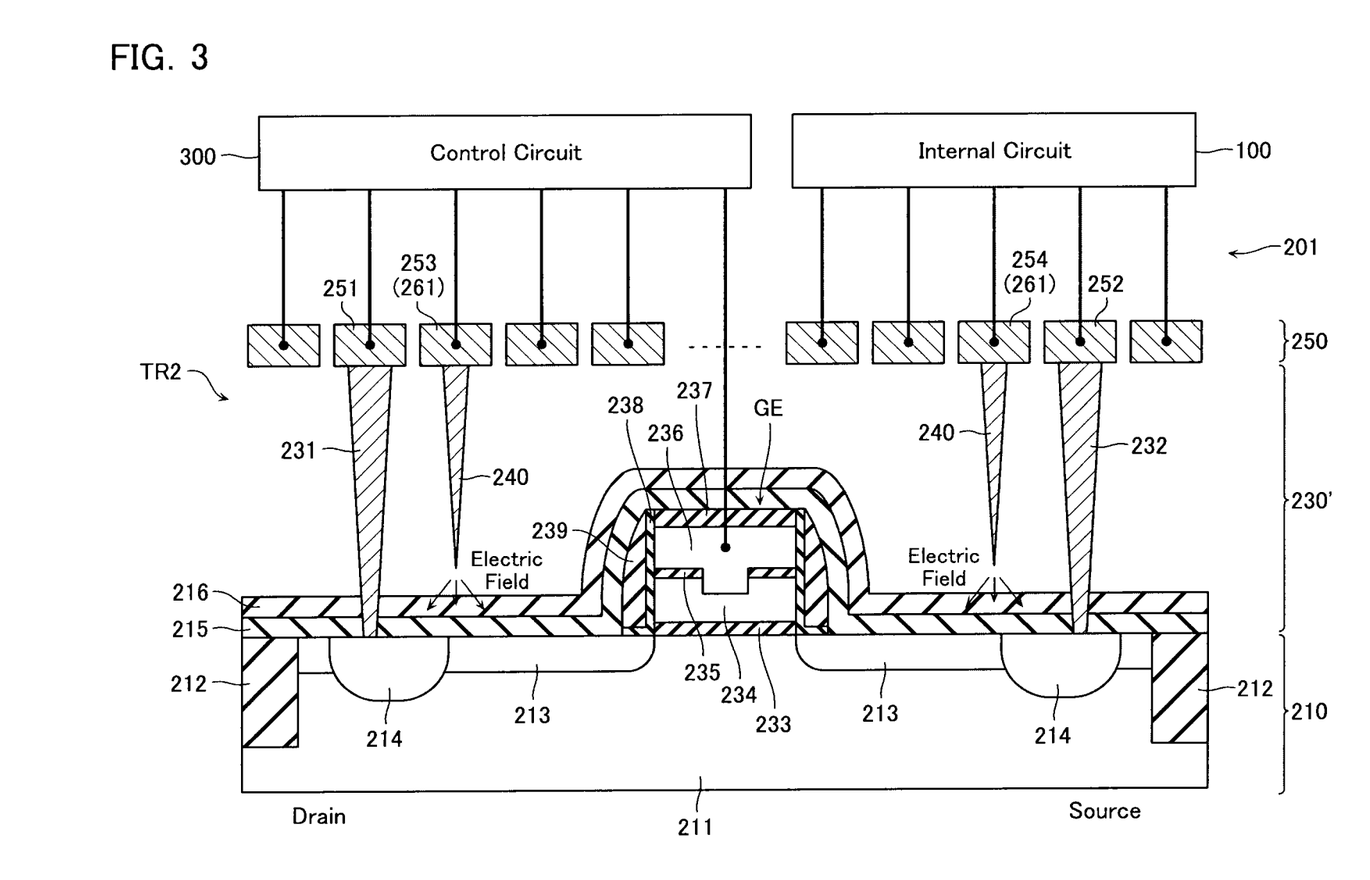
FIG. 3 is a schematic cross-sectional view of a voltage transfer circuit 201 according to a second embodiment.

Next, a semiconductor device according to a second embodiment will be described with reference to FIG. 3. FIG. 3 is a schematic cross-sectional view of a voltage transfer circuit 201 according to the present embodiment. Note that in the description below, portions similar to those of the first embodiment will be assigned with identical reference symbols to those assigned in the first embodiment, and descriptions thereof will be omitted.

As shown in FIG. 3, the semiconductor device according to the present embodiment is basically configured similarly to the semiconductor device according to the first embodiment, but differs in that the metal wiring lines 253 and 254 selected as the first wiring line 261 comprise a conductive body 240 protruding in a direction toward the semiconductor substrate 211. That is, in the present embodiment, by reducing a distance between the metal wiring lines 253 and 254 and the semiconductor substrate 211 by the conductive body 240, the electric field is applied from a closer position to the low concentration diffusion layer 213, whereby the resistance value of the low concentration diffusion layer 213 can be further reduced.

As shown in FIG. 3, in the present embodiment, the conductive body 240 is formed in a conical shape whose base surface contacts a lower surface of the metal wiring lines 253 or 254. Moreover, an angle of a side surface of the conductive body 240 matches an angle of a side surface of the drain contact electrode 231 and the source contact electrode 232. By, for example, forming a non-through hole in a batch when forming the contact hole in the inter layer insulating layer not illustrated, and implanting the conductive layer of a metal or the like not only in the contact hole but also in the non-through hole, such a conductive body 240 can be formed simultaneously to the drain contact electrode 231 and the source contact electrode 232.

Moreover, a lower end facing the semiconductor substrate 211, of the conductive body 240 according to the present embodiment, is sharp (radius of curvature of the lower end is small). Therefore, a fringe electric field generated from the side surface of the conductive body 240 can be made to reach the semiconductor substrate 211, in addition to the parallel planar electric field generated from the metal wiring lines 253 and 254. As a result, the resistance value of the low concentration diffusion layer 213 can be suitably reduced.

Note that, as shown in FIG. 3, in the present embodiment, the lower end of the conductive body 240 is positioned above the nitride layer 216. Therefore, the conductive body 240 and the semiconductor substrate 211 are suitably isolated from each other by the oxide layer 215 and the nitride layer 216.

Moreover, in the present embodiment, the voltage of the first wiring line 261 may be set larger than the above-described second voltage, similarly to in the first embodiment. However, in the present embodiment, the resistance value of the low concentration diffusion layer 213 can be reduced even if the voltage of the first wiring line 261 is set to the second voltage.

Third Embodiment

Figure 4:
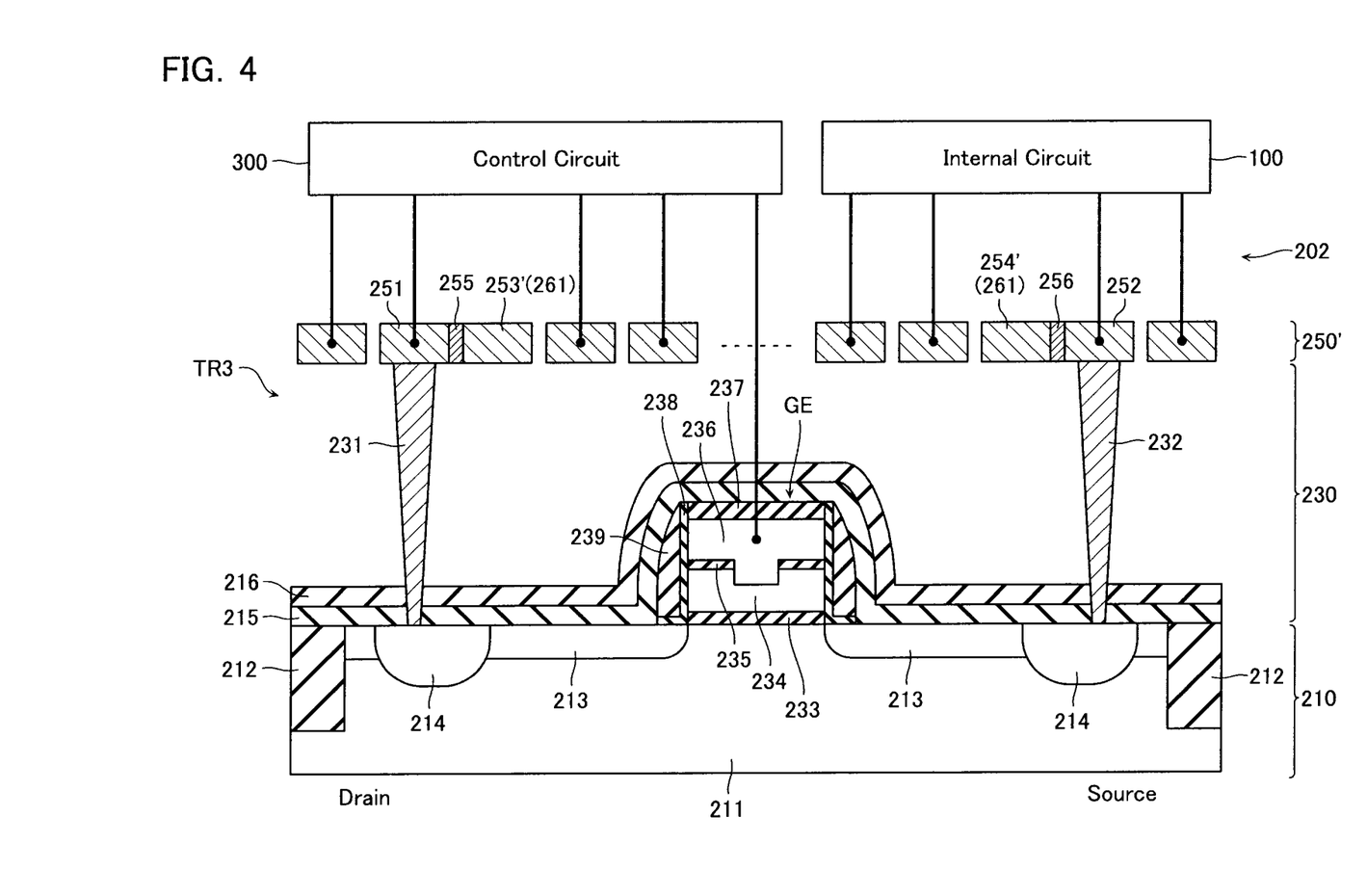
FIG. 4 is a schematic cross-sectional view of a voltage transfer circuit 202 according to a third embodiment.

Next, a semiconductor device according to a third embodiment will be described with reference to FIG. 4. FIG. 4 is a schematic cross-sectional view of a voltage transfer circuit 202 according to the present embodiment. Note that in the description below, portions similar to those of the first embodiment will be assigned with identical reference symbols to those assigned in the first embodiment, and descriptions thereof will be omitted.

As shown in FIG. 4, the semiconductor device according to the present embodiment is basically configured similarly to the semiconductor device according to the first embodiment, but differs in that a metal wiring line 253' selected as the first wiring line 261 is connected to the drain wiring line 251 via a connecting portion 255, and a metal wiring line 254' selected as the first wiring line 261 is connected to the source wiring line 252 via a connecting portion 256. That is, in the present embodiment, by respectively setting the metal wiring lines 253' and 254' selected as the first wiring line 261 to the same voltages as the drain wiring line 251 and the source wiring line 252, the resistance value of the low concentration diffusion layer 213 is lowered from the metal wiring lines 253' and 254'.

Note that in the example shown in FIG. 4, the metal wiring line 253' is adjacent to the drain wiring line 251, but it is also possible for a non-adjacent metal wiring line to be electrically connected to the drain wiring line 251. Similarly, in the example shown in FIG. 4, the metal wiring line 254' is adjacent to the source wiring line 252, but it is also possible for a non-adjacent metal wiring line to be electrically connected to the source wiring line 252.

Fourth Embodiment

Figure 5:
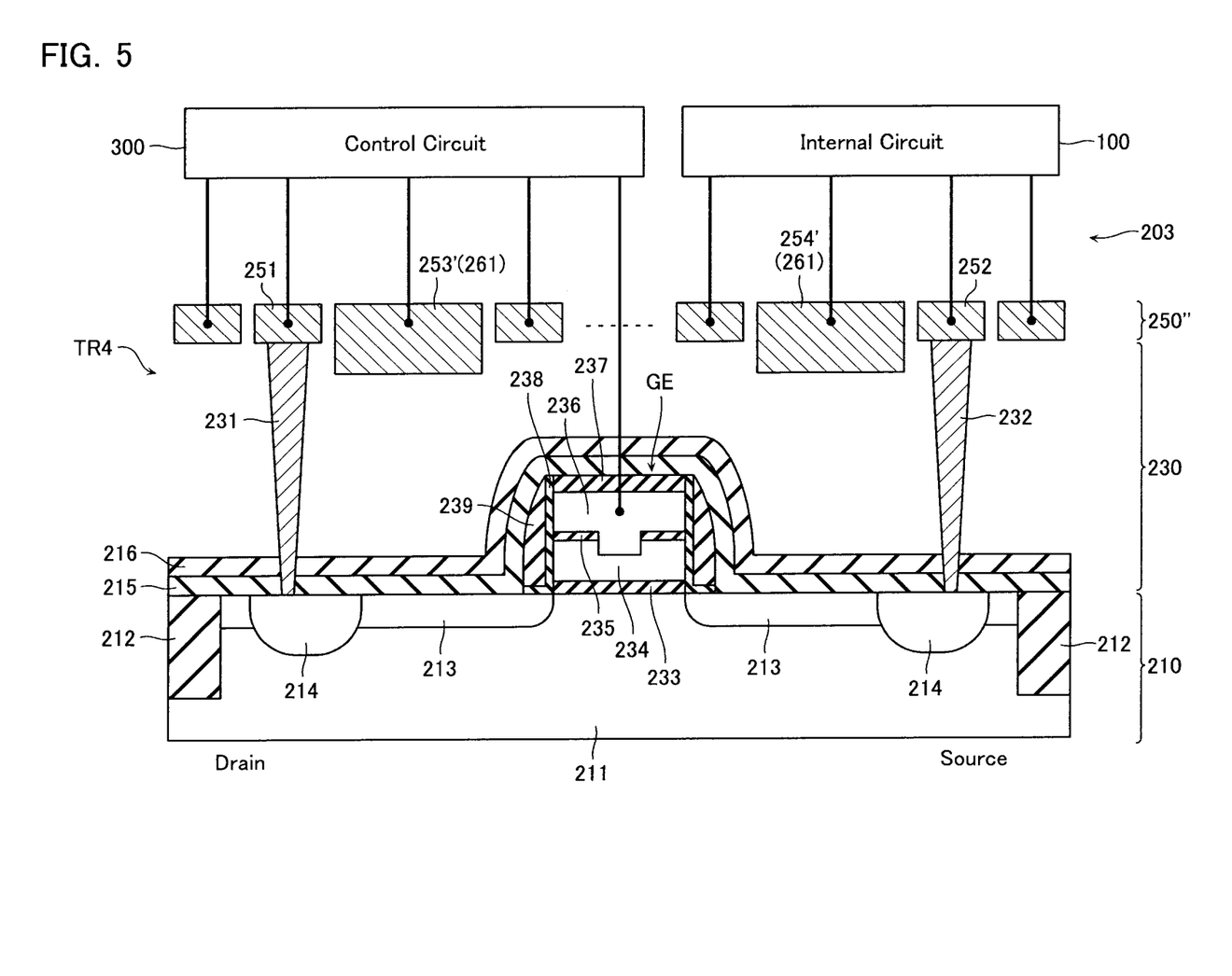
FIG. 5 is a schematic cross-sectional view of a voltage transfer circuit 203 according to a fourth embodiment.

Next, a semiconductor device according to a fourth embodiment will be described with reference to FIG. 5. FIG. 5 is a schematic cross-sectional view of a voltage transfer circuit 203 according to the present embodiment. Note that in the description below, portions similar to those of the first embodiment will be assigned with identical reference symbols to those assigned in the first embodiment, and descriptions thereof will be omitted.

As shown in FIG. 5, the semiconductor device according to the present embodiment is basically configured similarly to the semiconductor device according to the first embodiment, but differs in that metal wiring lines 253' and 254' selected as the first wiring line 261 are formed more thickly compared to the other metal wiring lines, and a height of a bottom surface of the metal wiring lines 253' and 254' is lower compared to a height of a bottom surface of the other metal wiring line. That is, in the present embodiment, a distance between the metal wiring lines 253' and 254' and the semiconductor substrate 211 is shortened, similarly to in the second embodiment. Therefore, the electric field is applied from a position close to the low concentration diffusion layer 213, whereby the resistance value of the low concentration diffusion layer 213 can be reduced.

Note that in the present embodiment, the metal wiring lines 253' and 254' selected as the first wiring line 261 are formed more thickly compared to the other metal wiring line. Therefore, when forming a trench not illustrated in which the metal wiring line is implanted, portions where the metal wiring lines 253' and 254' are formed, are formed comparatively thickly. Therefore, by utilizing a loading effect where etching rate increases as an opening of a mask broadens, the semiconductor device according to the present embodiment can be easily manufactured.

Fifth Embodiment

Next, a semiconductor device according to a fifth embodiment will be described with reference to FIGS. 6 to 9. As shown in FIGS. 6 to 9, the present embodiment describes an example where the semiconductor device according to the first embodiment is utilized in a plane type NAND flash memory. Note that in the description below, portions similar to those of the first embodiment will be assigned with identical reference symbols to those assigned in the first embodiment, and descriptions thereof will be omitted.

Figure 6:
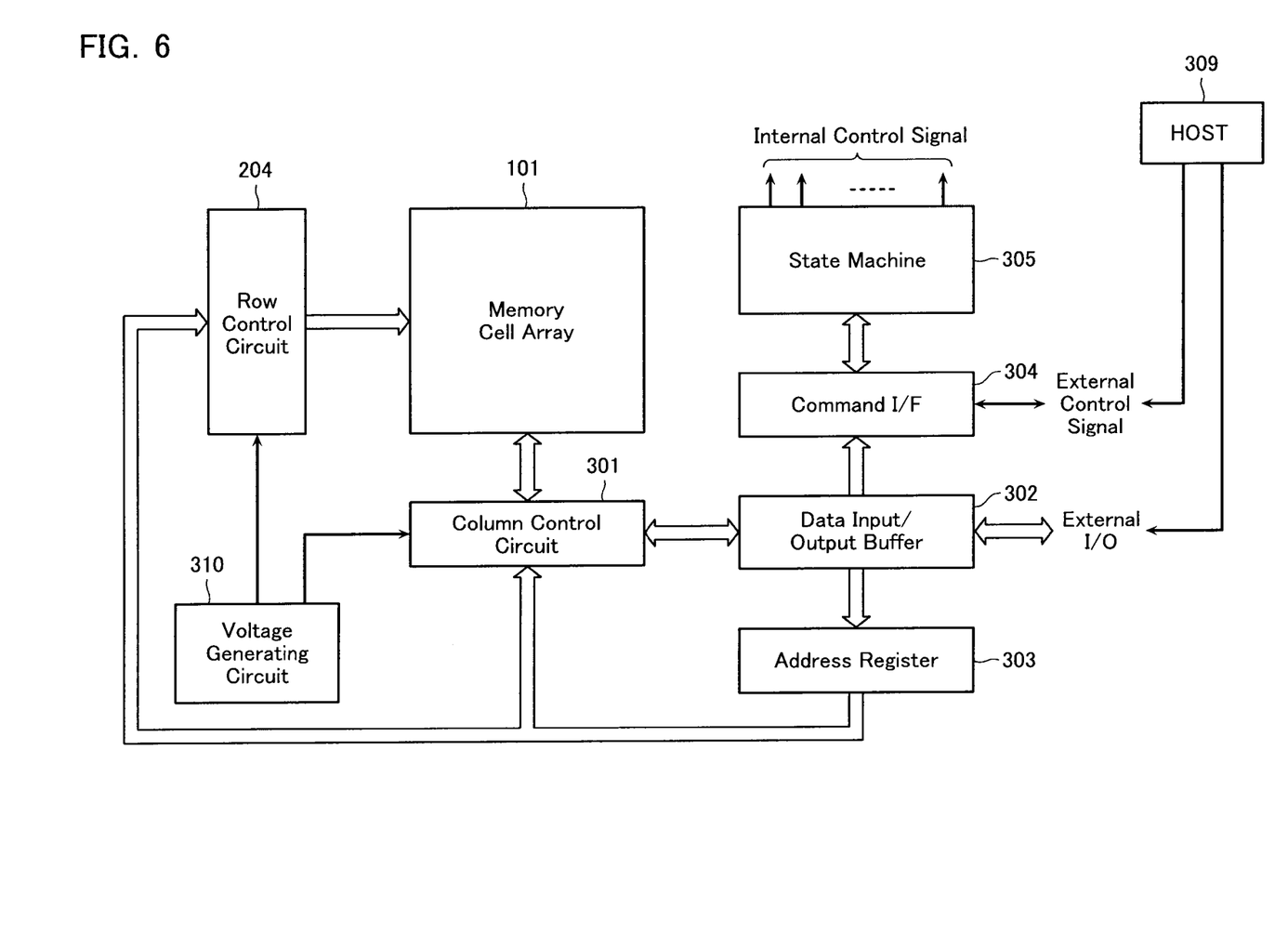
FIG. 6 is a block diagram of a semiconductor device according to a fifth embodiment.

FIG. 6 is a block diagram of a nonvolatile semiconductor memory device according to the present embodiment. This nonvolatile semiconductor memory device includes a memory cell array 101 having a plurality of memory cells MC disposed substantially in a matrix therein, and comprising a bit line BL and a word line WL disposed orthogonally to each other and connected to these memory cells MC. Note that the memory cell array 101 corresponds to the internal circuit in the present embodiment.

Provided in a periphery of the memory cell array 101 are a column control circuit 301 and a row control circuit 204. The column control circuit 301 controls the bit line BL and performs data erase of the memory cell, data write to the memory cell, and data read from the memory cell. The row control circuit 204 selects the word line WL and applies a voltage for data erase of the memory cell, data write to the memory cell, and data read from the memory cell. Note that the row control circuit 204 corresponds to the voltage transfer circuit in the present embodiment.

A data input/output buffer 302 is connected to an external host 309, via an I/O line, and receives write data, receives an erase command, outputs read data, and receives address data or command data. The data input/output buffer 302 sends received write data to the column control circuit 301, and receives data read from the column control circuit 301 to be outputted to external. An address supplied to the data input/output buffer 302 from external is sent to the column control circuit 301 and the row control circuit 204 via an address register 303.

Moreover, a command supplied to the data input/output buffer 302 from the host 309 is sent to a command interface 304. The command interface 304 receives an external control signal from the host 309, determines whether data inputted to the data input/output buffer 302 is write data or a command or an address, and, if a command, receives the data and transfers the data to a state machine 305 as a command signal.

The state machine 305 performs management of this nonvolatile memory overall, receives a command from the host 309, via the command interface 304, and performs management of read, write, erase, input/output of data, and so on.

In addition, it is also possible for the external host 309 to receive status information managed by the state machine 305 and judge an operation result. Moreover, this status information is utilized also in control of write and erase.

Furthermore, the state machine 305 controls a voltage generating circuit 310. This control enables the voltage generating circuit 310 to output a pulse of any voltage and any timing.

Now, the pulse formed by the voltage generating circuit 310 can be transferred to any wiring line selected by the column control circuit 301 and the row control circuit 204.

Note that the column control circuit 301, data input/output buffer 302, address register 303, command interface 304, state machine 305, and voltage generating circuit 310 correspond to the control circuit in the present embodiment.

Figure 7:
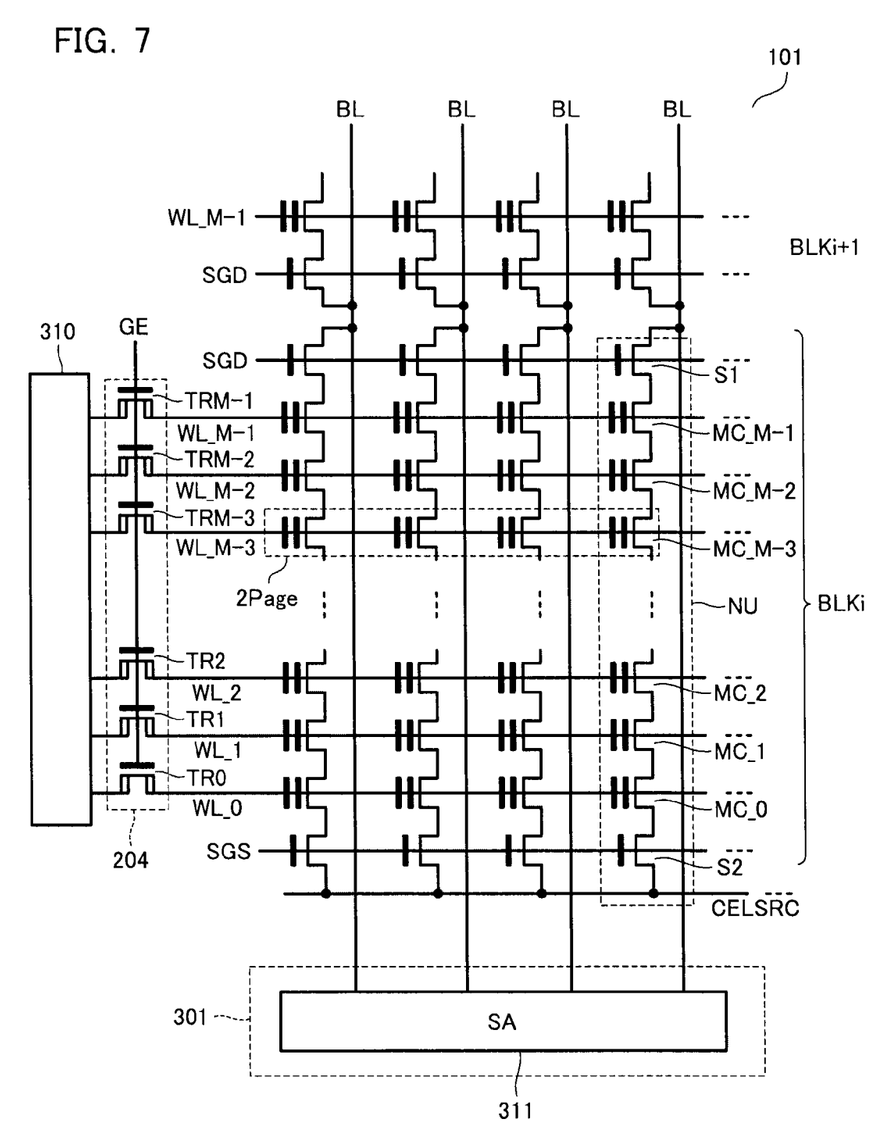
FIG. 7 is a circuit diagram showing a configuration of part of the semiconductor device according to the same embodiment.

FIG. 7 is a circuit diagram showing a configuration of part of the memory cell array 101 and the row control circuit 204. As shown in FIG. 7, the memory cell array 101 is configured having NAND cell units NU arranged therein, each of the NAND cell units NU including select gate transistors S1 and S2 respectively connected to both ends of a NAND string, the NAND string having M electrically rewritable nonvolatile memory cells MC_0 to MC_M−1 connected in series therein, sharing a source and a drain.

The NAND cell unit NU has one end (a select gate transistor S1 side) connected to the bit line BL and the other end (a select gate transistor S2 side) connected to a common source line CELSRC. Gate electrodes of the select gate transistors S1 and S2 are connected to select gate lines SGD and SGS. In addition, control gate electrodes of the memory cells MC_0 to MC_M−1 are respectively connected to word lines WL_0 to WL_M−1. The bit line BL is connected to a sense amplifier 311 of the column control circuit 301, and the word lines WL_0 to WL_M−1 and select gate lines SGD and SGS are connected to the row control circuit 204.

In the case of 2 bits/cell where 2 bits of data are stored in one memory cell MC, data stored in the plurality of memory cells MC connected to one word line WL configures 2 pages (an upper page UPPER and a lower page LOWER) of data.

One block BLK is formed by the plurality of NAND cell units NU sharing the word line WL. One block BLK forms a single unit of a data erase operation. The number of word lines WL in one block BLK in one memory cell array 101 is M, and, in the case of 2 bits/cell, the number of pages in one block is M×2 pages.

Figure 9:
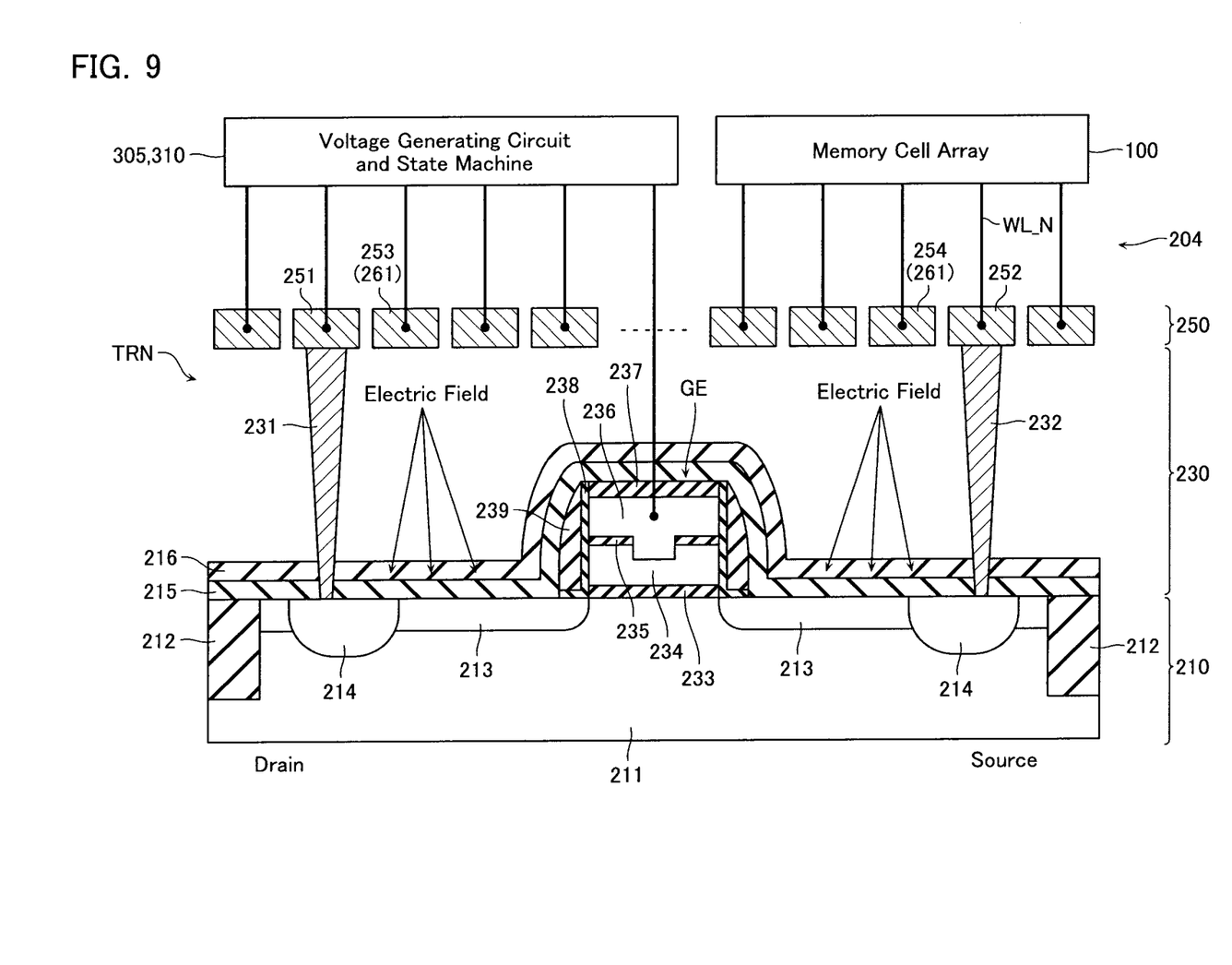
FIG. 9 is a schematic cross-sectional view of a voltage transfer circuit 204 according to the same embodiment.

Moreover, the row control circuit 204 comprises M high voltage transistors TR0 to TRM−1. Drain terminals of these plurality of high voltage transistors TR0 to TRM−1 are each connected to the voltage generating circuit 310. In addition, source terminals of the high voltage transistors TR0 to TRM−1 are respectively connected to the word lines WL_0 to WL_M−1. Moreover, gate electrodes GE of these plurality of high voltage transistors TR0 to TRM−1 are commonly connected. Note that as shown in FIG. 9, a cross-sectional structure of the row control circuit 204 is similar to that of the voltage transfer circuit according to the first embodiment described with reference to FIG. 2.

Figure 8:
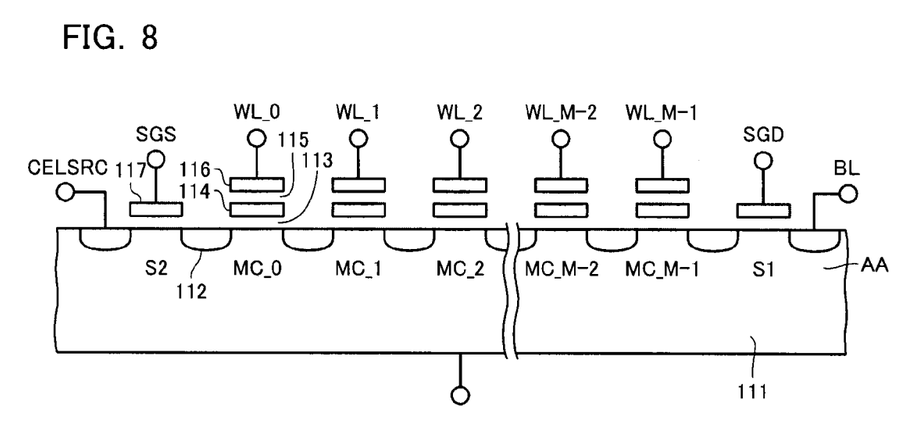
FIG. 8 is a schematic cross-sectional view showing a configuration of part of the semiconductor device according to the same embodiment.

FIG. 8 is a schematic cross-sectional view of the memory cells MC_0 to MC_M−1 and the select gate transistors S1 and S2. As shown in FIG. 8, formed in a semiconductor layer AA of an outer surface of a p type well 111 formed in a substrate is an n type diffusion layer 112 functioning as a source and a drain of a MOSFET configuring the memory cell MC. Moreover, formed on the semiconductor layer AA via a gate insulating film 113 is a charge accumulation layer 114 functioning as a charge accumulation layer, and formed on this charge accumulation layer 114 via an inter-gate insulating film 115 is a control gate 116. The control gate 116 configures the word line WL. In addition, the select gate transistors S1 and S2 include a select gate 117 formed on the well 111 via the gate insulating film 113. The select gate 117 configures the select gate lines SGS and SGD. The memory cells MC and the select gate transistors S1 and S2 are NAND-connected in a form where fellow adjacent ones share a drain and a source.

Next, a write operation that writes data to a certain memory cell MC_K (K is an integer of from 0 to M−1), in the semiconductor device according to the present embodiment, will be described with reference to FIG. 7.

In such a case, a voltage sufficiently large to set the select gate transistor to an ON state is transferred to a gate of the select gate transistor S2 via the select gate line SGS. Moreover, an intermediate voltage (for example, about 6 V) sufficiently large to set the memory cells MC_0 to MC_K−1 to an ON state regardless of data stored in these memory cells MC_0 to MC_K−1, is transferred to the word lines WL_0 to WL_K−1, via the high voltage transistors TR0 to TRK−1. As a result, the common source line CELSRC and the semiconductor layer AA of the memory cell MC_K (FIG. 8) are connected.

In addition, a write voltage (for example, about 20 to 30 V) sufficient for a charge to be accumulated in the charge accumulation layer 114 of the memory cell MC_K is transferred to the word line WL_K via the high voltage transistor TRK. As a result, electrons are injected into the charge accumulation layer 114 from the semiconductor layer AA via the tunnel insulating film 113 of the memory cell MC_K.

In this case, as shown in FIG. 9, the voltage generating circuit 310 and the state machine 305 functioning as the control circuit 300 adjust the voltage of the metal wiring line 253 facing the low concentration diffusion layer 213 between the drain contact electrode 231 and the gate electrode GE, to be larger than the intermediate voltage. Furthermore, the voltage generating circuit 310 and the state machine 305 functioning as the control circuit 300 adjust the voltage of the metal wiring line 254 facing the low concentration diffusion layer 213 between the source contact electrode 232 and the gate electrode GE, to be larger than the intermediate voltage. Therefore, the resistance value in the ON state of the high voltage transistor TR1 can be reduced more, and drive power of the row control circuit 204 can be improved more, compared to the case where, for example, the voltages of the metal wiring lines 253 and 254 are set to the intermediate voltage. That is, drive power of the row control circuit 204 and withstand voltage of the high voltage transistor TR1 can be simultaneously achieved.

Other Embodiments

In the fifth embodiment, an example where the semiconductor device according to the first embodiment was utilized in a plane type NAND flash memory, was described. However, it is also possible for the semiconductor devices according to the second through fourth embodiments to be applied to the plane type NAND flash memory. Moreover, it is also possible for the semiconductor devices according to the first through fourth embodiments to be applied to a three-dimensional type NAND flash memory in which memory cells are arranged in a direction perpendicular to a semiconductor substrate or to a NOR type flash memory, to a memory device other than a flash memory, or to a device other than a memory device.

Moreover, in the fifth embodiment, an example where the voltage transfer circuit 200 according to the first embodiment was utilized as the row control circuit 204 in the plane type NAND flash memory, was described. However, it is also possible for the voltage transfer circuits 200 to 203 according to the first through fourth embodiments to be utilized in another circuit, such as a hook-up.

Others

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device, comprising:
a field effect transistor comprising a semiconductor layer and a gate electrode;
a wiring line layer positioned above the field effect transistor; and
a control circuit that adjusts a voltage of a wiring line in the wiring line layer,
the wiring line layer comprising:
a contact wiring line connected to a source or a drain of the field effect transistor; and
a first wiring line facing a position between the gate electrode and the contact wiring line, of the semiconductor layer,
the control circuit
adjusting the contact wiring line to a certain voltage and
setting the first wiring line to a floating state.

2. The semiconductor device according to claim 1, wherein
the first wiring line comprises a conductive body that protrudes in a direction toward the semiconductor layer.

3. The semiconductor device according to claim 2,
further comprising a first insulating layer covering the semiconductor layer and the gate electrode,
wherein the lower end of the conductive body is positioned above the first insulating layer.

4. The semiconductor device according to claim 1, wherein
the first wiring line has a height of its lower surface which is closer to the semiconductor layer, compared to that of a certain wiring line of the wiring lines.

5. A semiconductor device, comprising:
an internal circuit;
a voltage transfer circuit that transfers a certain voltage to the internal circuit; and
a control circuit that supplies the certain voltage to the voltage transfer circuit,
the voltage transfer circuit comprising:
a field effect transistor comprising a semiconductor layer and a gate electrode; and
a wiring line layer positioned above the field effect transistor,
the wiring line layer comprising:
a contact wiring line connected to a source or a drain of the field effect transistor; and
a first wiring line facing a position between the gate electrode and the contact wiring line, of the semiconductor layer, and
the control circuit setting a voltage of the first wiring line when transferring the certain voltage to the internal circuit higher compared to a voltage of the first wiring line when not transferring a voltage to the internal circuit.

6. The semiconductor device according to claim 5, wherein
the first wiring line is not connected to the internal circuit.

7. The semiconductor device according to claim 5, wherein
the internal circuit comprises a memory cell that includes a charge accumulation layer and a control gate electrode, and
the control circuit
transfers to the control gate electrode a write voltage at which a charge is accumulated in the charge accumulation layer and an intermediate voltage at which the memory cell attains an ON state regardless of a charge accumulated in the charge accumulation layer, and
when transferring the write voltage to the gate electrode, sets a voltage of the first wiring line to a voltage which is larger than the intermediate voltage.

8. The semiconductor device according to claim 5, wherein
the first wiring line comprises a conductive body that protrudes in a direction toward the semiconductor layer.

9. The semiconductor device according to claim 8,
further comprising a first insulating layer covering the semiconductor layer and the gate electrode,
wherein the lower end of the conductive body is positioned above the first insulating layer.

10. The semiconductor device according to claim 5, wherein
the first wiring line has a height of its lower surface which is closer to the semiconductor layer, compared to that of a certain wiring line of the wiring lines.

11. The semiconductor device according to claim 5, wherein
the first wiring line is electrically connected to the contact wiring line.

12. A semiconductor device, comprising:
a field effect transistor comprising a semiconductor layer and a gate electrode; and
a wiring line layer positioned above the field effect transistor,
the wiring line layer comprising:
a contact wiring line connected to a source or a drain of the field effect transistor; and a first wiring line facing a position between the gate electrode and the contact wiring line, of the semiconductor layer, a lower surface of the first wiring line being provided with a certain portion facing the semiconductor layer from a position lower than a lower surface of a certain wiring line of the wiring lines.

13. The semiconductor device according to claim 12, wherein the first wiring line comprises a conductive body that protrudes in a direction toward the semiconductor layer, and the certain portion is the conductive body.

14. The semiconductor device according to claim 13, further comprising a first insulating layer covering the semiconductor layer and the gate electrode, wherein the lower end of the conductive body is positioned above the first insulating layer.

15. The semiconductor device according to claim 12, wherein the first wiring line has a height of its lower surface which is closer to the semiconductor layer, compared to that of a certain wiring line of the wiring lines, and the certain portion is the lower surface of the first wiring line.

16. The semiconductor device according to claim 12, wherein the first wiring line is electrically connected to the contact wiring line.

\* \* \* \* \*